United States Patent
Sogo

[19]

[11] Patent Number: 6,043,534
[45] Date of Patent: Mar. 28, 2000

[54] HIGH VOLTAGE SEMICONDUCTOR DEVICE

[75] Inventor: Seiji Sogo, Kyoto, Japan

[73] Assignee: Matsushita Electronics Corporation, Osaka, Japan

[21] Appl. No.: 09/052,142

[22] Filed: Mar. 31, 1998

[30] Foreign Application Priority Data

Nov. 5, 1997 [JP] Japan .................................... 9-302705

[51] Int. Cl.$^7$ ........................... H01L 29/76; H01L 23/58; H01L 29/94; H01L 29/00
[52] U.S. Cl. ........................ 257/343; 257/491; 257/409; 257/544
[58] Field of Search ................................. 257/491, 343, 257/544, 545, 409, 329

[56] References Cited

U.S. PATENT DOCUMENTS 4,811,075  3/1989  Eklund .................................... 257/409

FOREIGN PATENT DOCUMENTS

| 0474479 | 3/1992 | Japan | 257/329 |
| 4107877 | 4/1992 | Japan | 257/409 |
| 4180249 | 6/1992 | Japan | 257/544 |
| 4241463 | 8/1992 | Japan | 257/409 |
| 8172184 | 7/1996 | Japan | 257/409 |

*Primary Examiner*—Steven H. Loke
*Attorney, Agent, or Firm*—Stevens, Davis, Miller & Mosher, L.L.P.

[57] ABSTRACT

An $N^-$- region is formed by diffusion on a P- semiconductor substrate, and a P- region is formed in a surface portion of the $N^-$- region. A $P^+$- region is formed in an outer peripheral portion of the $N^-$- region, to suppress expansion of a depletion layer of the P- semiconductor substrate when a high voltage is applied. A gate oxide film is formed on the semiconductor substrate, and a gate electrode of polycrystalline silicon is formed on the gate oxide film, particularly on a channel region which is formed by the semiconductor substrate and the $P^+$- region, which is as a whole the same as a structure of a lateral N-channel MOSFET. Circuit elements are formed within the $N^-$- region, and a high voltage is applied. Circuit portions are isolated as the gate electrode and a source region are grounded. This reduces the number of steps for manufacturing a high-insulation IC, increases a breakdown voltage, and integrates the circuit denser.

24 Claims, 13 Drawing Sheets

HIGH VOLTAGE SEMICONDUCTOR DEVICE

TECHNICAL FIELD

The present invention relates to a semiconductor device, and more particularly, to a high-insulation semiconductor integrated circuit device, such as a driving circuit for an inverter, which can control various types of load apparatuses such as a fluorescent lamp and a motor.

BACKGROUND ART

An inverter circuit is customarily used as a circuit for driving a load such as a fluorescent lamp and a motor. FIG. 12 is a circuit diagram showing a schematic structure of an inverter circuit. In this inverter circuit, switching devices such as high-insulation MOSFETs 23, 24 are connected to a power source line which has a high potential (e.g., 100 to 700 V). An output to a load 25 is supplied from a junction 26 between the two high-insulation MOSFETs 23, 24.

A driving circuit 27 which drives the two high-insulation MOSFETs 23, 24 divides an input signal which is supplied from outside (denoted as "EXTERNAL SIGNAL" in FIG. 12) into a high-voltage circuit portion 28 (which operates with a power source potential of 120 V to 720 V, for example, while a reference potential is usually 100 to 700 V) and a low-voltage circuit portion 29 (which operates with a power source potential of 20 V or lower, for example), so that gates of the respective high-insulation MOSFETs 23, 24 are provided with signals. The driving circuit 27, in many cases, is an integrated circuit in which the high-voltage circuit portion 28 and the low-voltage circuit portion 29 are formed in the same semiconductor chip.

FIG. 13 is a schematic cross sectional view showing a cross sectional structure of a conventional integrated circuit. FIG. 13 omits circuit elements which are formed inside the integrated circuit. A major characteristic of the conventional structure is that an N⁻- epitaxial layer 31 is formed on a P⁻- semiconductor substrate 30 and that a P⁺- region 32 which has a high concentration and separates the N⁻- epitaxial layer 31 is formed by diffusion for the purpose of isolating a high voltage circuit and a low voltage circuit from each other (i.e., a PN isolation). The N⁻- epitaxial layer 31 is isolated as the P⁻- semiconductor substrate 30 and the P⁺- region 32 are grounded, whereby a high-voltage circuit portion A (not shown) and a low-voltage circuit portion B (not shown) are formed respectively in the P⁻- semiconductor substrate 30 and the P⁺- region 32. Denoted at 33 is a protective film which is formed in a surface of the P⁻- semiconductor substrate 30. Elements which constitute the high-voltage circuit portion A and the low-voltage circuit portion B which are not shown are formed by bipolar transistors or MOSFETs.

In such an integrated circuit using the P⁻- semiconductor substrate 30, as a voltage for using the integrated circuit is higher, the N⁻- epitaxial layer 31 needs be thicker. FIG. 14 shows a cross sectional structure of an integrated circuit which is disclosed in Japanese Patent Application Laid-Open Gazette No. 4-180249 (Applicant: Mitsubishi Electric Corporation), for example. In this integrated circuit, an N⁻- epitaxial layer 31 is formed in a P⁻- semiconductor substrate 30, and after forming an N- buried layer 35 which serves as a collector of a bipolar transistor in the N⁻- epitaxial layer 31, a second N⁻- epitaxial layer 34 is formed over the N⁻- epitaxial layer 31 to thereby form a P⁺- layer 32 which acts as an isolation region, and circuit elements are formed in the thick N⁻- epitaxial layers 31, 34. Denoted at 36 is a base region, denoted at 37 is an emitter region, demoted at 38 is a collector wall region, and denoted at 39 is an electrode.

As shown in the examples in FIGS. 13 and 14, in general, a conventional high-insulation integrated circuit comprising a high-voltage circuit portion is manufactured using the P⁻- semiconductor substrate 30 which includes the thick N⁻- epitaxial layers 31, 34. In this case, fabrication of the substrate requires a number of manufacturing processes and a long processing time, which is disadvantageous in terms of manufacturing costs.

In addition, even if the N⁻- epitaxial layers 31, 34 are formed thick, a breakdown voltage in the isolation is at most about 200 V, which can not allow a use for driving a high-insulation transistor to which a higher voltage of a few hundreds volts or higher, for instance, is applied.

Further, as the N⁻- epitaxial layers 31, 34 become thicker, the P⁺- layer 32 for element isolation needs to have a high concentration so as to be diffused deeper. However, a high concentration of the P⁺- layer 32 reduces an insulation breakdown voltage between the P⁺- layer 32 and the N⁻- epitaxial layers 31, 34.

Moreover, since the P⁺- layer 32 is diffused largely not only in the direction of the depth but in a lateral direction as well, the surface area size of the isolation region becomes large relative to the surface area size of a chip as a whole, which is disadvantageous to integration.

For the reasons described above, an apparatus which does not use the N⁻- epitaxial layers 31, 34 and a PN isolation is more desirable, with respect to manufacturing costs, a higher breakdown voltage of a produce and a higher integration of the circuit portions.

SUMMARY OF THE INVENTION

Hence, an object of the present invention is to provide a semiconductor device which realizes high-insulated isolation between a low-voltage circuit portion and a high-voltage circuit portion which is equipped with a highly advanced function and is highly integrated, while decreasing the number of manufacturing steps and thereby reducing costs.

In a semiconductor device according to the present invention, a second conductivity type region is formed within a first conductivity type semiconductor substrate, a first conductivity type region is formed within the second conductivity type region so as to surround a portion within the second conductivity type region, a first conductivity type high concentration region is formed within the first conductivity type semiconductor substrate so as to surround the second conductivity type region, a gate electrode is formed on a channel region, which is disposed between the second conductivity type region and the first conductivity type high concentration region, through a gate insulation film, a first circuit element is formed in the portion within the second conductivity type region, and the first conductivity type region, the first conductivity type high concentration region and the gate electrode are electrically connected to each other. In this case, it is possible to form a second circuit element in the first conductivity type semiconductor substrate outside the first conductivity type high concentration region. As the first circuit element, a low-insulation i.e., a low dielectric strength circuit element can be used.

Further, the low-insulation circuit element is surrounded by the first conductivity type region, the channel region and the first conductivity type high concentration region, and the first conductivity type region, a source electrode and the gate electrode are at a reference potential on the low voltage side.

Hence, the reference potential on the low voltage side is set to a substrate potential and a high voltage is applied to the second conductivity type region, to thereby form a depletion layer which extends into the channel region which surrounds the low-insulation circuit element, the second conductivity type region, and the first conductivity type region which is formed within the second conductivity type region, so that insulated isolation of the high-voltage circuit portion and the low-voltage circuit portion is possible with a high breakdown voltage of about 1,000 V.

In this structure, since a source region and the region which corresponds to the gate electrode are set to the reference potential on the low voltage side, namely, the substrate potential, the depletion layer expands in the direction of the depth in the vicinity of the junction portion between the first conductivity type semiconductor substrate and the second conductivity type region. Since the junction portion between the second conductivity type region and the first conductivity type region set to the reference potential on the low voltage side is extended longer, the depletion layer expands laterally in the channel region. This allows insulated isolation of a portion within the second conductivity type region and the first conductivity type semiconductor substrate outside the first conductivity type high concentration region with a high breakdown voltage of about 1,000 V. Further, since the structure does not use an epitaxial layer and the first conductivity type region for element isolation which are a characteristic of the conventional semiconductor device, it is possible to reduce the number of the steps and improve the breakdown voltage characteristic. This is because of use of the breakdown voltage characteristic of a high-insulation lateral MOSFET which includes an opposite conductivity type diffusion layer within an extended drain region, that is, a drain-source breakdown voltage characteristic of when the source region and the gate electrode are grounded. In addition, integration is possible in the portion within the second conductivity type region in which the first circuit element is formed, which in turn makes it possible to realize a highly advanced function.

Further, in the semiconductor device according to the present invention, at least a portion of the first conductivity type region is formed across a surface-side boundary between the second conductivity type region and the first conductivity type semiconductor substrate.

In this structure, it is possible to set a potential of the first conductivity type region to the substrate potential (i.e., the reference potential) without forming a contact in the first conductivity type region, and therefore, it is possible to avoid a decrease in the breakdown voltage which is otherwise caused when the potential of the first conductivity type region is set to the substrate potential (i.e., the reference potential). That is, it is possible to electrically connect the first conductivity type region to the first conductivity type semiconductor substrate without opening a hole in a field oxide film on the first conductivity type region, for the purpose of setting the potential of the first conductivity type region to the substrate potential and accordingly applying a reverse bias between the second conductivity type region and the first conductivity type region. This does not degrade the high-insulation characteristic.

Further, in the semiconductor device according to the present invention, a diffusion depth of the first conductivity type region is shallower than a diffusion depth of the second conductivity type region.

In this structure, a depletion layer is formed the second conductivity type region and the first conductivity type region from a bottom portion of the first conductivity type region, and therefore, it is possible to improve the breakdown voltage characteristic.

Further, in the semiconductor device according to the present invention, the gate electrode may be formed extending on a thick insulation film which is formed on the first conductivity type region.

In this structure, since the gate electrode extends even on the field oxide film which is formed on the first conductivity type region, it is possible to moderate a field concentration under the gate oxide film and prevent dielectric breakdown. Hence, it is possible to further improve the breakdown voltage characteristic.

Further, in the semiconductor device according to the present invention, where there are a plurality of the first circuit elements, the plurality of the first circuit elements may be isolated from each other by a thick insulation film which is formed on the second conductivity type region.

This structure eliminates the necessity of using a PN isolation which reaches the first conductivity type semiconductor substrate which is otherwise used in the conventional CMOS process for the purpose of isolation of the circuit elements, which makes such a circuit structure possible without ensuring isolation with a high breakdown voltage.

Further, in the semiconductor device according to the present invention, the second conductivity type region may be formed within the first conductivity type semiconductor substrate, except at a central portion of the first conductivity type semiconductor substrate, the first conductivity type region may be formed within the second conductivity type region so as to surround the central portion of the first conductivity type semiconductor substrate, the first conductivity type high concentration region may be formed within the central portion of the first conductivity type semiconductor substrate so as to surround a portion of the central portion of the first conductivity type semiconductor substrate, the gate electrode may be formed on a channel region, which is disposed between the second conductivity type region and the first conductivity type high concentration region, through a gate insulation film, the first circuit element which is formed by a low-insulation circuit element, for instance, may be formed in the second conductivity type region outside the first conductivity type region. In this case as well, an effect which is similar to the above is attained by setting the potentials in a similar manner to the above.

DETAILED DESCRIPTION

Figure 1:
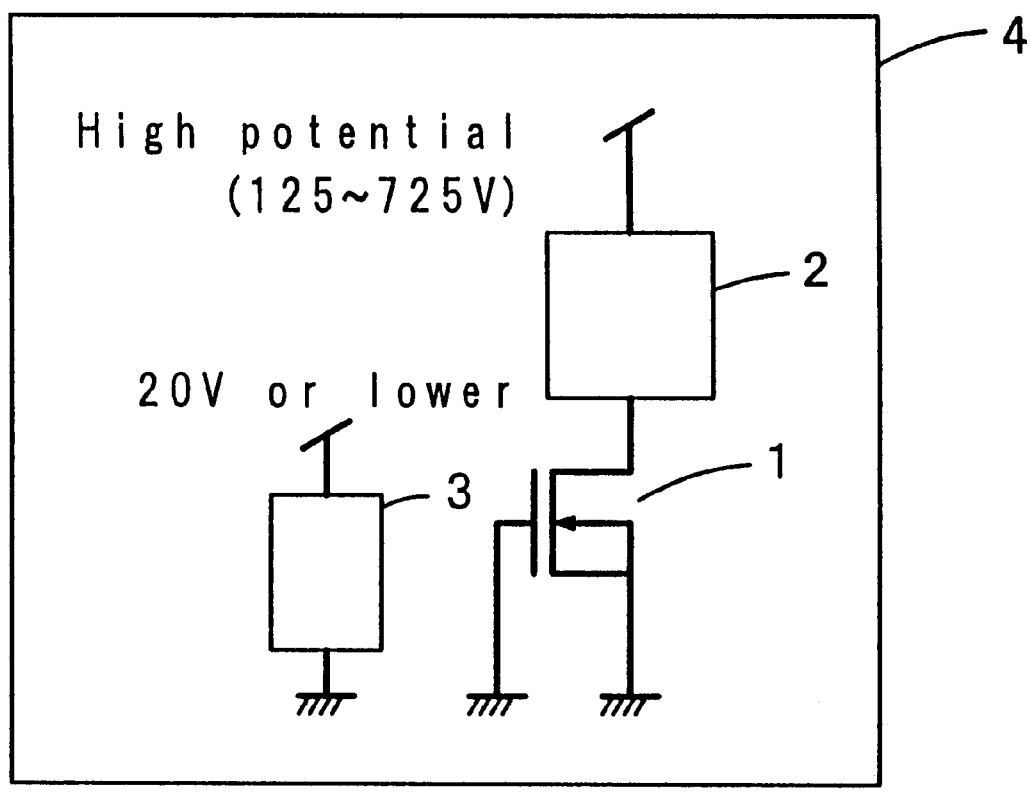
FIG. 1 is a schematic diagram showing a structure of a semiconductor device according to a preferred embodiment of the present invention.

A semiconductor device according to a preferred embodiment of the present invention will be described with reference to FIG. 1. FIG. 1 shows a schematic structure of the semiconductor device according to the present invention. Since an isolation structure of a high-voltage circuit portion is similar to a structure of a high-insulation lateral MOSFET, FIG. 1 shows the structure as a MOSFET. In FIG. 1, as a source and a gate are grounded, a high-voltage circuit portion 2, which is formed in a region which corresponds to an extended drain region of a high-insulation MOSFET 1, is electrically isolated. The high-voltage circuit portion 2 (which operates with a reference potential of 100 to 700 V and a control potential of 120 to 720 V, for example) is formed by a bipolar transistor or a MOSFET which outputs a control signal to a gate of an external MOSFET and which is formed by means of a single P- or N- well or a PN junction. A low-voltage circuit portion 3 operates with a proper low voltage-controlled circuit voltage (20 V or lower, for instance), and is formed by a bipolar transistor or a MOSFET. The high-voltage circuit portion 2 and the low-voltage circuit portion 3 are formed in a single semiconductor chip 4.

While the foregoing is related to an example where the high-voltage circuit portion of the semiconductor device according to the present invention operates with a high voltage with as high reference potential as 100 V to 1,000 V, use of the present invention is not limited to such a condition. Rather, the semiconductor device according to the present invention can operate with a single power source (e.g., 20 V or lower), for example, like a regular IC.

Now, specific examples of the semiconductor device according to the present invention will be described.

Figure 2:
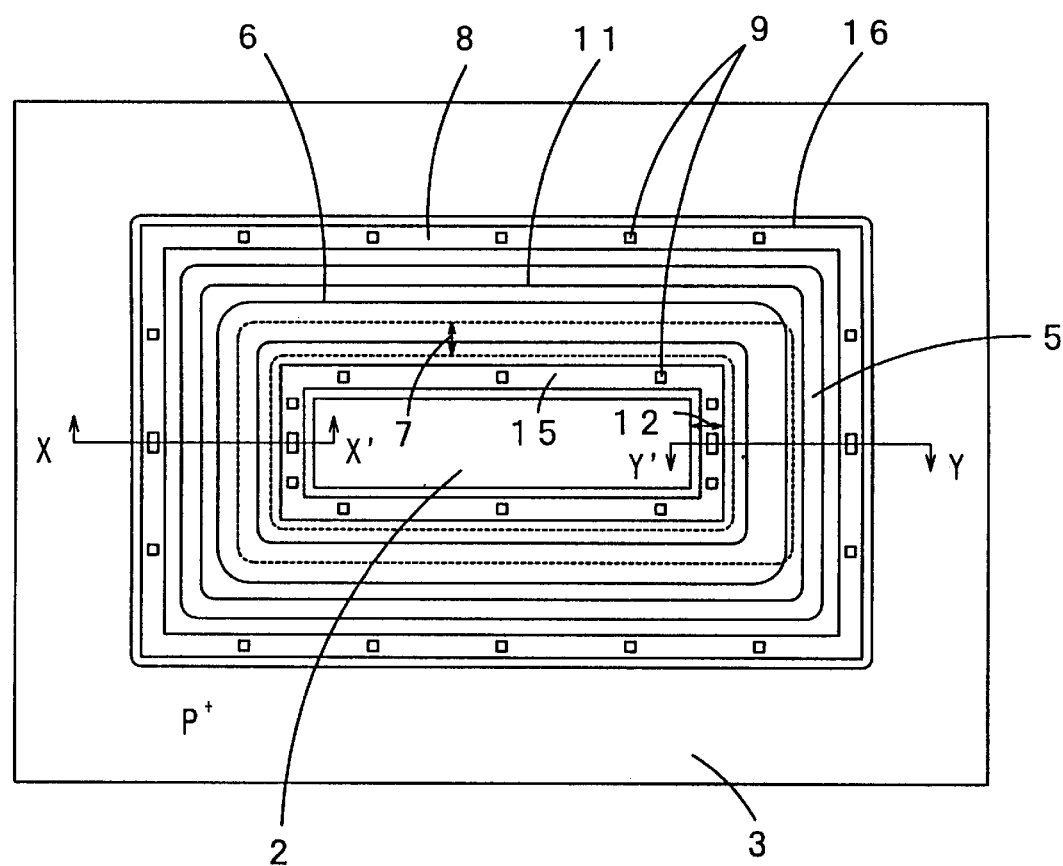
FIG. 2 is a plan view showing a structure of the semiconductor device according to the preferred embodiment of the present invention.

FIG. 2 is a plan view of the semiconductor device according to the preferred embodiment of the present invention. Since the preferred embodiment of the present invention uses a number of structures which are common to those of a MOSFET, respective portions will be referred to by the same element names which are used for a MOSFET.

An N$^-$- region 6 for forming the high-voltage circuit portion 2 is formed in a P$^-$- semiconductor substrate 5. As the shape of the N$^-$- region 6, a circular shape is the most ideal for prevention of a decrease in a breakdown voltage due to a field concentration which is otherwise created at a corner of the N$^-$- region 6 when a high voltage is applied. However, if a restriction to the chip area size or arrangement does not allow a circular shape, the N$^-$- region 6 may be formed in a rectangular or square shape whose corner portions are rounded as shown in FIG. 2. In such a case, the curvature of the corner portions is preferably as large as possible, since that prevents a field concentration at the corner portions of the rectangle or square region, and hence, improves a breakdown voltage characteristic.

Figure 3:
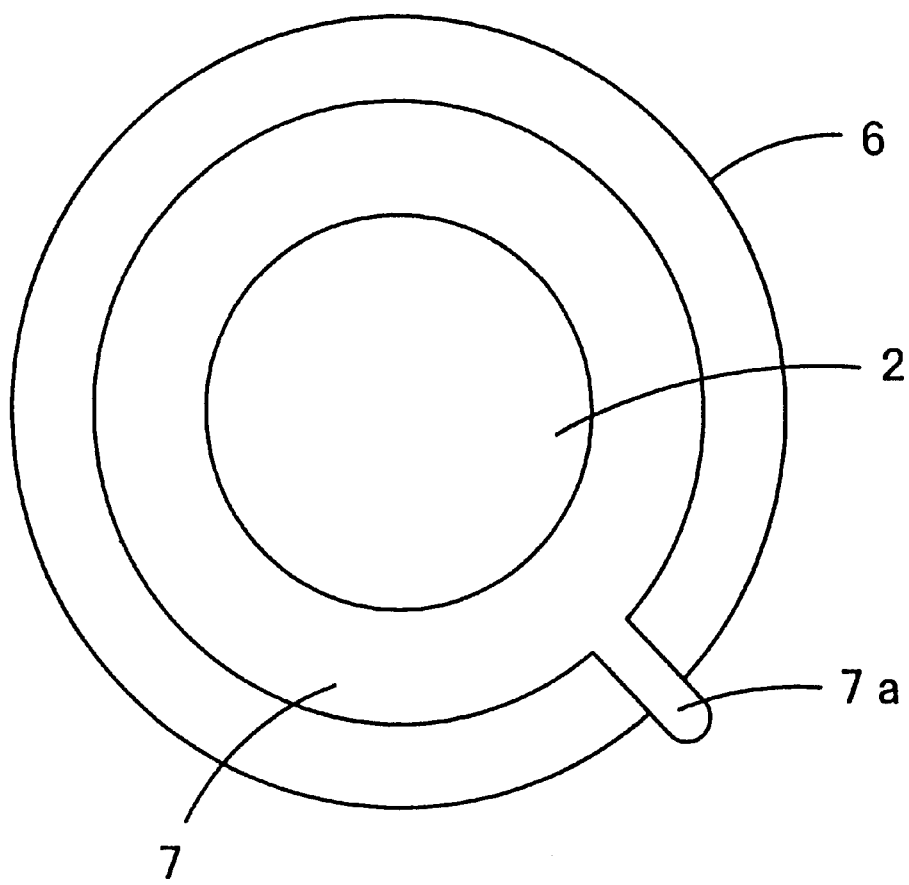
FIGS. 3 through 5 are schematic plan views showing structures of the semiconductor device according to other examples of the preferred embodiment of the present invention.
Figure 4:
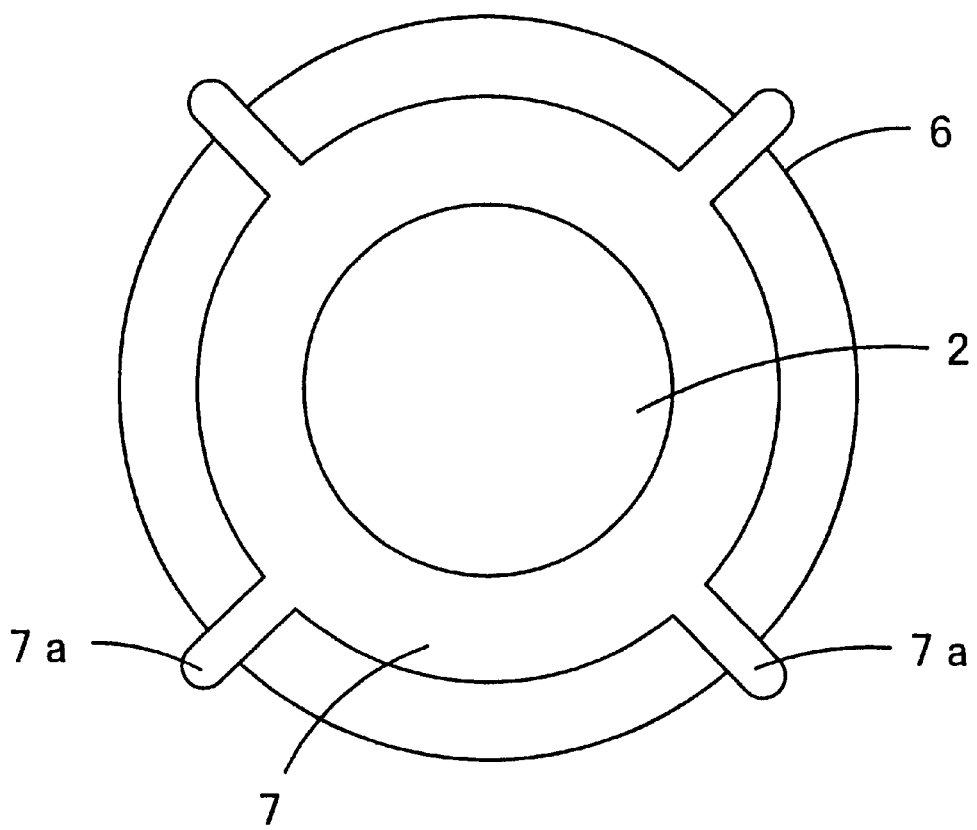
Figure 5:
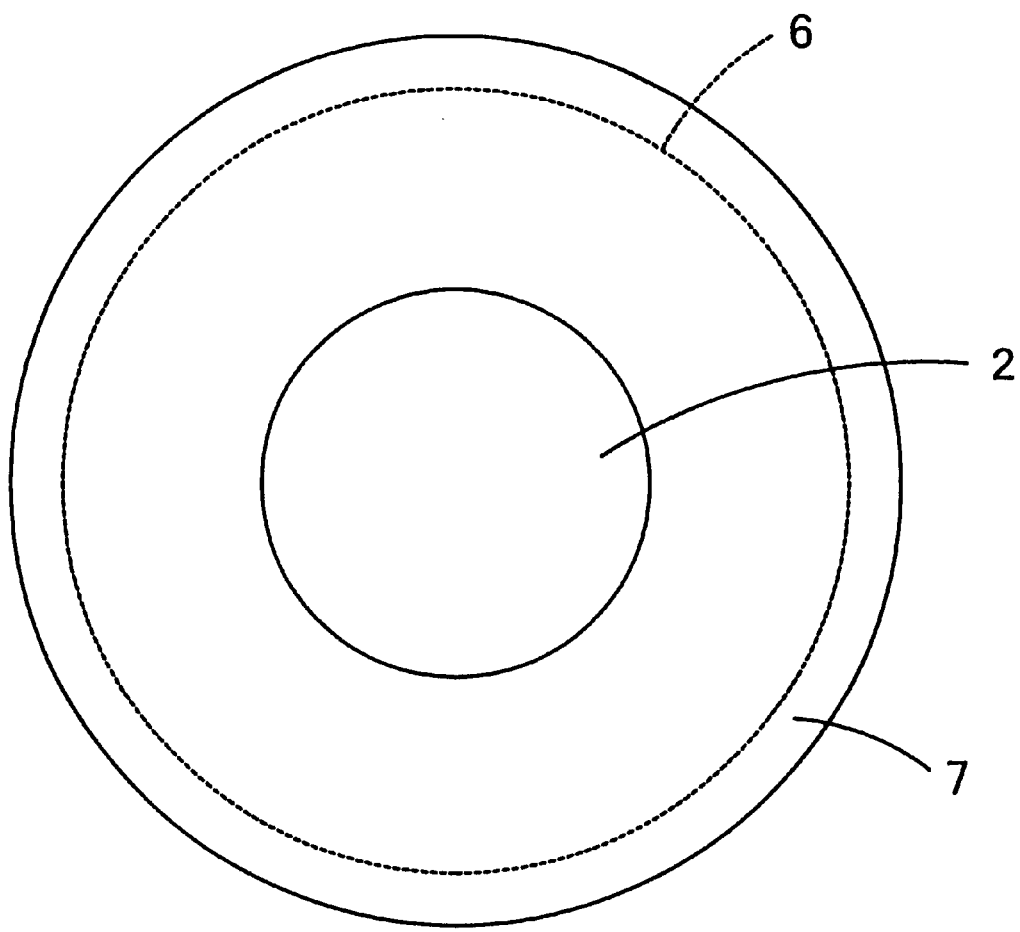

Further, P- regions 7 which have a square-like ring shape are diffused in the N$^-$- region 6. The P- regions 7 are arranged in the N$^-$- region 6 such that the P- regions 7 partially covers the N$^-$- region 6 to reach the P$^-$- semiconductor substrate 5. This sets a potential of the P- regions 7 to a substrate potential (which is the lowest potential). Although FIG. 2 shows that one side of the rectangle overlaps the P$^-$- semiconductor substrate 5, this is not limiting. Rather, if the N$^-$- region 6 is circular, for instance, the P- regions 7 may have such a, shape which allows one tongue-like projected region 7a as that shown in FIG. 3 or a plurality of tongue-like projected regions 7a as those shown in FIG. 4 to reach the P$^-$- semiconductor substrate 5 across the N$^-$- region 6, in which case the P- regions 7 may have an optional number of projecting portions which project over the P$^-$- semiconductor substrate 5. Further, as shown in FIG. 5, an outer peripheral edge portion of the P- regions 7 as a whole may reach the P$^-$- semiconductor substrate 5 across the N$^-$- region 6.

In an outer peripheral portion of the N$^-$- region 6, a P$^+$- region 8 which has a higher concentration than the P$^-$- semiconductor substrate 5 is formed, to thereby suppress a depletion layer in the P$^-$- semiconductor substrate 5 which becomes a channel region when a high voltage is applied and to prevent the depletion layer from exerting an influence over the low-voltage circuit portion 3. Since the depletion layer in the P$^-$- semiconductor substrate 5 needs to expand to a certain extent for a high-insulation characteristic of the semiconductor device, it is necessary to separate the N$^-$- region 6 and the P$^+$-region 8 by a certain distance from each other. Although it is possible to optionally set the distance in accordance with a necessary high-insulation characteristic, as the distance is increased, the high-insulation characteristic is improved better. To expand the depletion layer laterally, it is necessary to extend a junction portion between the P- regions 7 and the N$^-$- region 6 longer in the lateral direction in the channel region.

With respect to a relationship between the concentration of the P$^-$- semiconductor substrate 5 and the concentration of the P$^+$-region 8 which functions as a contact, the concentration of the P$^-$- semiconductor substrate 5 is $1.0 \times 10^{13}$ to $1.0 \times 10^{15}$/cm$^2$, while the P$^+$-region 8 only needs to have a higher impurity concentration than the P$^-$- semiconductor substrate 5. Preferably, the P$^+$- region 8 has a surface concentration of $1.0 \times 10^{16}$ to $1.0 \times 10^{17}$/cm$^2$. Further, an impurity concentration of the P- regions 7 is set approximately to $5.0 \times 10^{15}$ to $5.0 \times 10^{16}$.

A gate electrode 11 is formed on the N$^-$- region 6, the P$^-$- semiconductor substrate 5 and the P$^+$- region 8 through a gate oxide film 10. While the gate electrode 11 partially overlaps the P- regions 7, a distance the gate electrode 11 overlaps is related to the high-insulation characteristic. When the high-insulation characteristic is to be improved, the P- regions 7 may be isolated from the gate electrode 11.

The N$^-$- region 6, the P$^-$- semiconductor substrate 5 and the P$^+$- region 8 are provided with potentials respectively by a contact window 9, a drain electrode 15 and a source electrode 16. The high-voltage circuit portion 2 is formed in the N$^-$- region 6.

Figure 6:
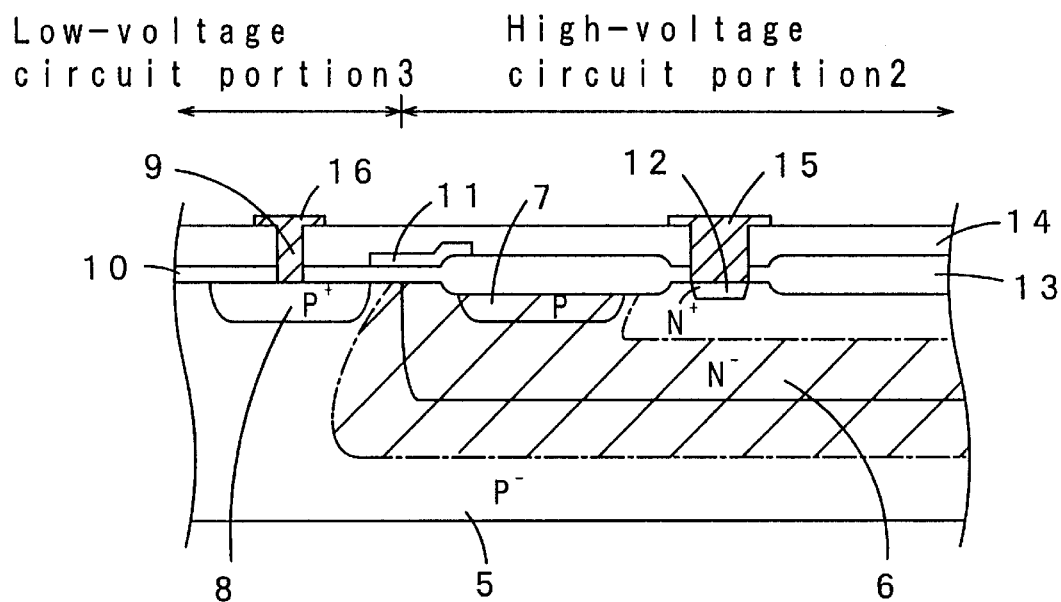
FIG. 6 is a cross sectional view taken along the X–X' line of FIG. 2.
Figure 7:
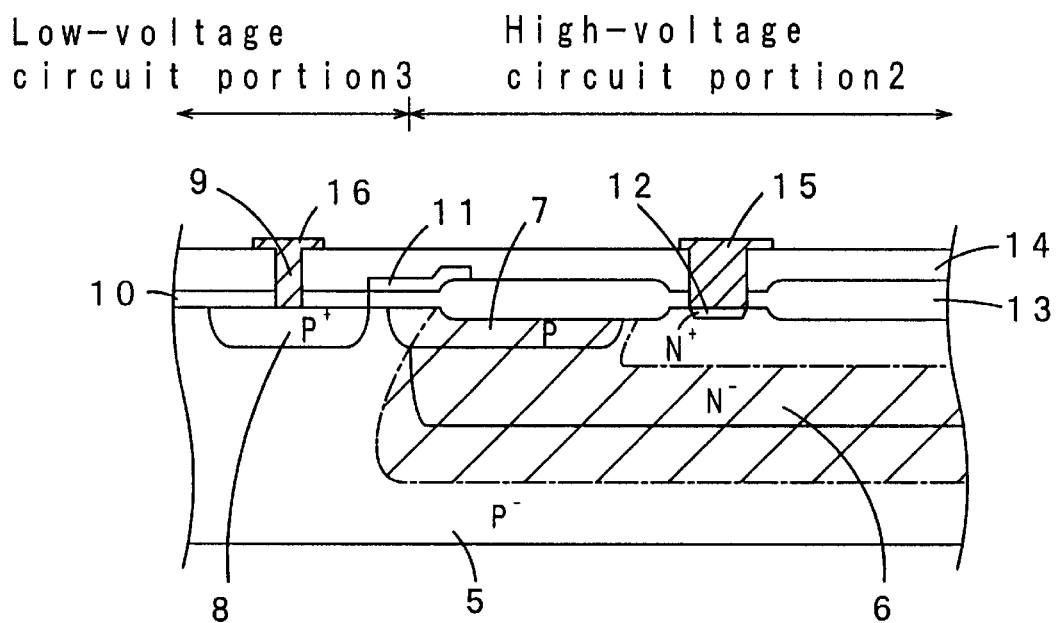
FIG. 7 is a cross sectional view taken along the Y–Y' line of FIG. 2.

FIGS. 6 and 7 are cross sectional views of the semiconductor device according to the present invention, particularly showing portions which are related to isolation between the high-voltage circuit portion 2 and the low-voltage circuit portion 3 taken along the X–X' line and the Y–Y' line of FIG. 2.

In FIGS. 6 and 7, the N⁻- region 6 is formed by diffusion in the P⁻- semiconductor substrate 5, and the P- regions 7 which have a square-like ring shape are formed by diffusion in the N⁻- region 6. Although the foregoing is related to a case where the P- regions 7 are formed in a surface portion of the N⁻- region 6, the P- regions 7 perform the same function even when formed inside the N⁻- region 6.

The diffusion depth of the P- regions 7 needs be shallower than that of the N⁻- region 6, and is set to about 0.3 to 2 μm, for instance. This is because if the diffusion depth of the P- regions 7 is deep, the N⁻- region 6 is divided into pieces by the P- regions 7, which does not realize the high-insulated isolation according to the embodiment of the present invention.

In addition, as indicated at the Y–Y' line in FIG. 2, the P- regions 7 partially reach the P⁻- semiconductor substrate 5 across the N⁻- region 6, and therefore, are provided with the same potential as the substrate potential.

The P⁺- region 8 which has a square-like ring shape and has a higher concentration than the P⁻- semiconductor substrate 5 is formed in the outer peripheral portion of the N⁻- region 6. The gate oxide film 10 (which has a thickness of about 0.02 to 0.1 μm) is formed on the P⁻- semiconductor substrate 5, and the gate electrode 11 of polycrystalline silicon which has a square-like ring shape is formed on the gate oxide film 10 across the channel region and a field oxide film 13 on the N⁻- region 6, which is as a whole the same as a structure of a lateral N-channel MOSFET. The gate electrode and the P- regions 7 partially overlap each other as shown in FIG. 2.

A drain portion is formed by an N⁺- region 12 and the N⁻- region 6 which corresponds to the extended drain region, while a source region is formed by the P⁺- region 8 which has a higher concentration than the P⁻- semiconductor substrate 5. Since potentials which are set for the N⁺- region 12 and the P- regions 7 are different from each other in the drain portion, it is necessary to separate the N⁺- region 12 and the P- regions 7 from each other. Further, the thick field oxide film 13 (which has a thickness of about 0.6 to 1.0 μm) is formed on the N⁻- region 6, and the gate electrode 11 partially overlaps the thick field oxide film 13. A layer isolation film 14 is formed on the thick field oxide film 13 and the gate oxide film 10. Potentials for the drain portion and the source portion are supplied from the drain electrode 15 and the source electrode 16.

A major characteristic of this semiconductor device is that the source region which is formed by the P⁺- region 8 and the gate electrode 11 are grounded. When the high-voltage circuit portion 2 operates due to a low-insulation circuit element which is formed in the N⁻- region 6 which corresponds to the extended drain region, a high voltage is supplied to the N⁻- region 6 by the drain electrode 15 through the source electrode 16. FIG. 6 shows this condition. In FIG. 6, the shadowed region is the junction portion between the P- regions 7 and the N⁻- region 6 and the depletion layer which grows from the junction portion between, the P⁻- semiconductor substrate 5 and the N⁻- region 6. This depletion layer expands largely in the direction of the depth of the P⁻- semiconductor substrate 5 and also in the lateral direction in the channel region. Utilizing the depletion layer which expands in this manner, insulated isolation of the high-voltage circuit portion 2 and the low-voltage circuit portion 3 is possible with a high breakdown voltage of about 1,000 V.

A potential distribution within the depletion layer is related to overlapping of the gate electrode 31 and the P⁻- regions 7. As the overlapping portion is smaller, the potential distribution within the depletion layer remains stable even if a high voltage is applied. Further, as the gate electrode 11 is formed on the field oxide film 13 on the N⁻- region 6, a field concentration under the gate oxide film 10 is mitigated, which prevents dielectric breakdown.

In addition, when the depletion layer expands laterally in the surface of the substrate, if the depletion layer contacts the P⁺- region 8, the depletion layer does not grow from the P⁺- region 8 in the direction toward the substrate because of the high concentration region (i. e. , the P⁺- region 8), and therefore, even if the low-voltage circuit portion 3 is located close to the high concentration region (i.e., the P⁺- region 8), an influence of the depletion layer is not created.

FIG. 7 shows a cross section taken along the Y–Y' line of FIG. 2. As compared with FIG. 6, to set a potential for the P- regions 7, the P- regions 7 and the P⁻- semiconductor substrate 5 are connected directly to each other with the P- regions 7 reaching the P⁻- semiconductor substrate 5 across the N⁻- region 6. This makes it unnecessary to open a hole in the field oxide film 13 on the P- regions 7 for the purpose of setting the P- regions 7 at the substrate potential, thereby avoiding a decrease in the breakdown voltage due to a contact.

Figure 8:
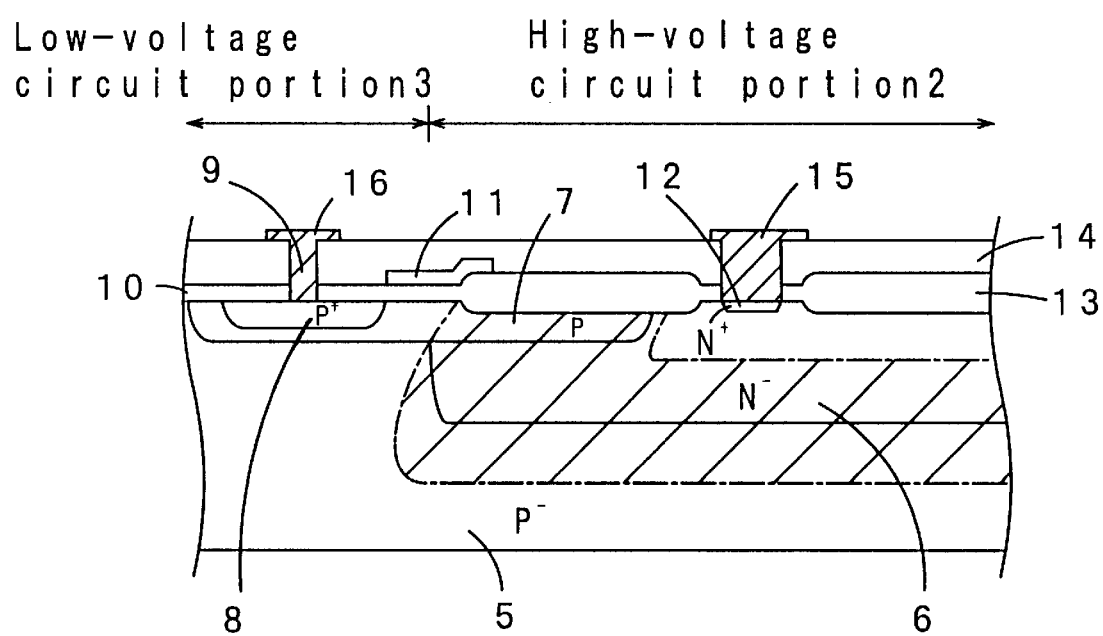
FIG. 8 is a cross sectional view showing a structure of the semiconductor device according to other example of the preferred embodiment of the present invention.

The P- regions 7 may extend into the low-voltage circuit portion 3, passing the P⁺- region 8, as shown in FIG. 8. That is, the P⁺- region 8 may be formed within the P- regions 7.

Since the structure of the semiconductor device described above is similar to a structure of a lateral MOSFET, as compared with a conventional semiconductor device which uses a semiconductor substrate which includes an epitaxial layer, in order to manufacture a semiconductor device which has a similar high-insulation characteristic, the conventional semiconductor device needs a step of forming a thick N⁻- epitaxial layer (usually 20 to 30 μm), a subsequent mask step of forming a P⁺- region for element separation, a step of impurity doping, and a diffusion step. On the other hand, the present invention does not need these steps, and hence, is excellent that manufacturing steps are fewer.

Figure 9:
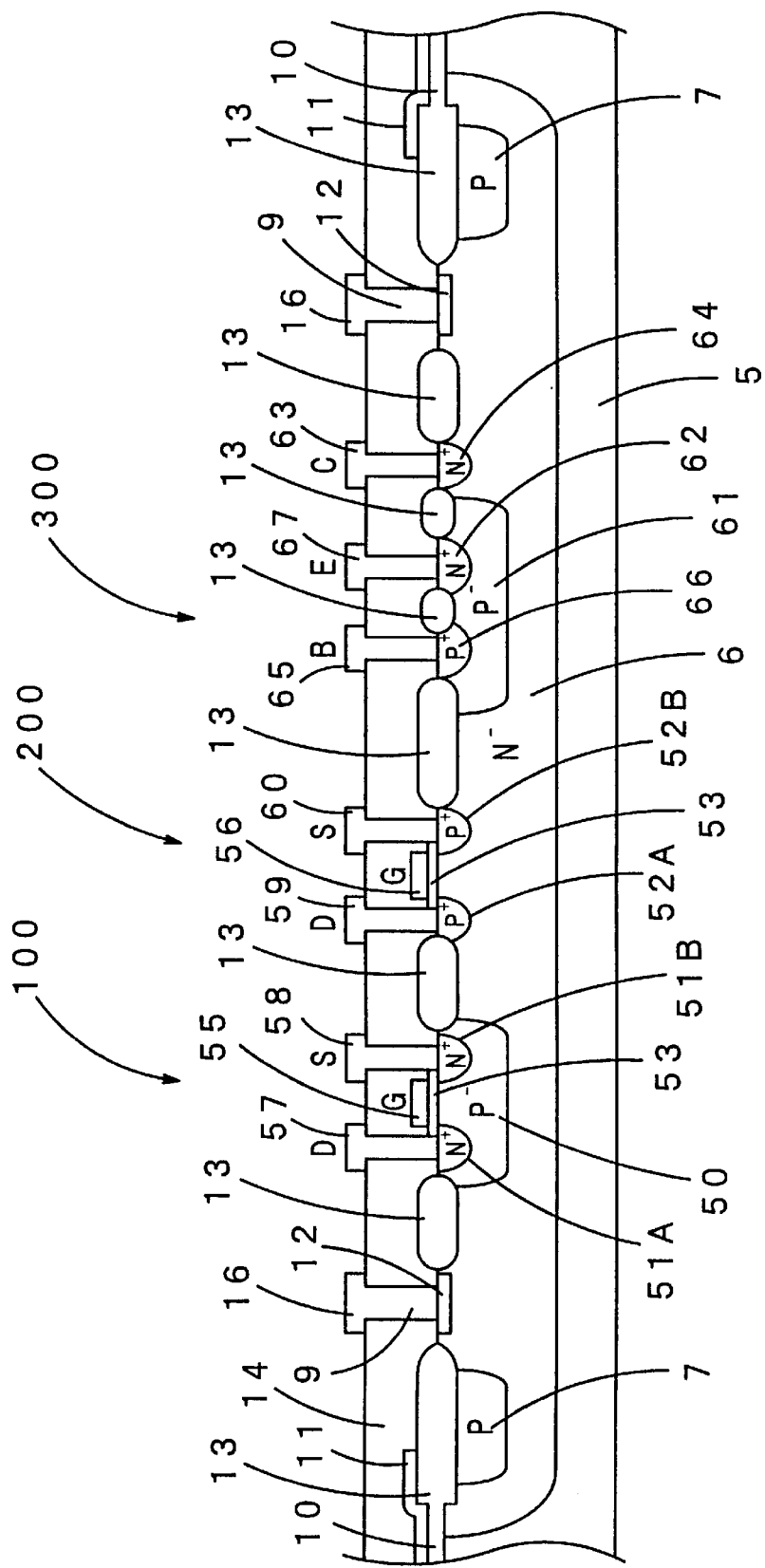
FIG. 9 is a cross sectional view showing a structure of an element in a high-voltage circuit portion in the semiconductor device according to other example of the preferred embodiment of the present invention.

Next, FIG. 9 shows low-insulation circuit elements within the high-voltage circuit portion 2, in the semiconductor device according to the preferred embodiment of the present invention. FIG. 9 shows structures of P- channel MOSFET 200 and an N-channel MOSFET 100 which are necessary as CMOS circuits and a bipolar transistor 300 which is used for an analog operation. The respective elements are formed in the N⁻- region 6 which is shown in FIGS. 6 and 7. With respect to the N-channel MOSFET 100, a drain portion and a source portion need be formed within a P⁻- region, to thereby form a channel. Hence, in the N-channel MOSFET 100, a P⁻- diffusion layer 50 is formed in the N⁻- region 6, and N⁺- regions 51A, 51B for the drain and the source are formed within the P⁻- diffusion layer 50. In the P-channel MOSFET 200, P⁺- regions 52A, 52B for a drain and a source are formed in the N⁻- region 6. In the respective MOSFETs 100, 200, a gate oxide film 53 is formed above the N⁻- region 6, and gate electrodes 55, 56 are formed on the gate oxide film 53. The P⁺- regions 51A, 51B for the drain and the source of the N-channel MOSFET 100 are provided with potentials by a drain electrode 57 and a source electrode 58. The P⁺- regions 52A, 52B for the drain and the source of the P-channel MOSFET 200 are provided with potentials by a drain electrode 59 and a source electrode 60.

As to the bipolar transistor 300, it is possible to form an NPN type transistor whose collector is the N⁻- region 6, whose base is a P⁻- diffusion layer 61 and whose emitter is an $N^+$- region 62. A collector potential is supplied to the $N^-$-region 6 by a collector electrode 63 through an $N^+$- region 64. A base potential is supplied to the $P^-$- diffusion layer 61 by a base electrode 65 through a $P^+$- region 66. An emitter potential is supplied to the $N^+$- region 62 by an emitter electrode 67.

Further, in the semiconductor device according to the preferred embodiment of the present invention, isolation of the respective elements within the circuit portions is realized by the same self-isolation as that for a regular CMOS process, using the thick field oxide film 13, so that a $P^+$-region for isolation will not be used at all. This is more advantageous to integration of the circuit than in the conventional semiconductor device.

Now, a relationship between the principal structures of the preferred embodiment of the present invention described above and associated effects will be summarized below.

First, in this semiconductor device, the $N^-$- region 6 is formed in the $P^-$- semiconductor substrate 5, the P- regions 7 are formed in the $N^-$- region 6 so as to surround a portion of the $N^-$- region 6, the $P^+$- region 8 is formed in the $P^-$-semiconductor substrate 5 so as to surround the $N^-$- region 6, the gate electrode 11 is formed through the gate insulation film on the channel region which is disposed between the $N^-$- region 6 and the $P^+$- region 8, a first circuit element is formed as the high-voltage circuit portion 2 in a portion of the $N^-$- region 6, and the P- regions 7, the $P^+$- region 8 and the gate electrode 11 are electrically connected to each other.

In this structure, the depletion layer expands in the vicinity of the junction portion between the $P^-$- semiconductor substrate 5 and the $N^-$- region 6 in the direction of the depth since the source region and the region which corresponds to the gate electrode 11 are set to a reference potential on the low voltage side, namely, the substrate potential, and the depletion layer expands laterally in the channel region since the junction portion between the P-regions 7 and the $N^-$- region 6 which is set to the reference potential on the low voltage side is extended longer, so that insulated isolation of a portion of the $N^-$- region 6 and the $P^-$- semiconductor substrate 5 which is outside the $P^+$-region 8 is possible with a high breakdown voltage of about 1,000 V. Further, since the structure does not use an epitaxial layer and the P- regions 7 which are otherwise disposed for element isolation as a characteristic of the conventional semiconductor device, it is possible to reduce the number of the steps and improve the breakdown voltage characteristic. This is because of use of the breakdown voltage characteristic of a high-insulation lateral MOSFET which includes an opposite conductivity type diffusion layer within an extended drain region, that is, a drain-source breakdown voltage characteristic of when the source region and the gate electrode 11 are grounded. In addition, integration is possible in the portion of the $N^-$- region 6 in which the first circuit element is formed, namely, the high-voltage circuit portion 2, which in turn makes it possible to realize a highly advanced function.

Second, in this semiconductor device, a second circuit element is formed as the low-voltage circuit portion 3, in the $P^-$- semiconductor substrate 5 outside the $P^+$- region 8.

In this structure, it is possible to isolate, with a high breakdown voltage, the high-voltage circuit portion 2, which is formed by the first circuit element which is formed in the portion of the $N^-$- region 6, from the low-voltage circuit portion 3, which is formed by the second circuit element which is formed in the $P^-$- semiconductor substrate 5 outside the $P^+$- region 8.

Third, in this semiconductor device, the first circuit element which forms the high-voltage circuit portion 2 is a low-insulation circuit element.

In this structure, since the first circuit element which is formed in the portion of the $N^-$- region 6 is a low-insulation circuit element, it is easy to form a circuit within the portion of the $N^-$- region 6.

Fourth, in this semiconductor device, the P- regions 7, the $P^+$- region 8 and the gate electrode 11 are set to the reference potential of the circuit which is formed in the $P^-$- semiconductor substrate 5 outside the $P^+$- region 8.

In this structure, it is possible to isolate, with a high breakdown voltage, the first circuit element of the high-voltage circuit portion 2, which is formed in the portion of the $N^-$- region 6, from the second circuit element of the low-voltage circuit portion 3, which is formed in the $P^-$-semiconductor substrate 5 outside the $P^+$- region 8.

Fifth, in this semiconductor device, at least a portion of the P- regions 7 is formed across a boundary between the $N^-$- region 6 and the $P^-$- semiconductor substrate 5 on the surface side.

In this structure, it is possible to set the potential of the P-regions 7 to the substrate potential (i.e., the reference potential) without forming a contact in the P- regions 7, and therefore, it is possible to avoid a decrease in the breakdown voltage which is otherwise caused when the potential of the P- regions 7 is set to the substrate potential (i.e., the reference potential). That is, it is possible to electrically connect the P- regions 7 to the $P^-$- semiconductor substrate 5 without opening a hole in the field oxide film 13 on the P-regions 7, for the purpose of setting the potential of the P-regions 7 to the substrate potential and accordingly applying a reverse bias between the $N^-$- region 6 and the P- regions 7. This does not degrade the high-insulation characteristic.

Sixth, in this semiconductor device, the diffusion depth of the P- regions 7 is shallower than that of the $N^-$- region 6.

In this structure, since the depletion layer is formed in the $N^-$- region 6 and the P- regions 7 from a bottom portion of the P- regions 7, it is possible to improve the breakdown voltage characteristic.

Seventh, in this semiconductor device, the gate electrode 11 is formed extending even on the thick insulation film which is formed on the P- regions 7.

In this structure, since the gate electrode 11 extends even on the field oxide film 13 which is the thick insulation film which is formed on the P- regions 7, it is possible to moderate a field concentration under the gate oxide film 10 and prevent dielectric breakdown, and therefore, it is possible to further improve the breakdown voltage characteristic.

Eighth, in this semiconductor device, the plan configuration of the $N^-$- region 6 is a rectangular or square shape whose corner portions have a curvature or a circular shape.

In this structure, it is possible to prevent a field concentration at the corner portions of the region when a high voltage is applied to the $N^-$- region 6, and improve the breakdown voltage characteristic.

Ninth, in this semiconductor device, an operation reference potential of the first circuit element of the high-voltage circuit portion 2 is higher than the reference potential of the circuit which is formed in the $P^-$- semiconductor substrate 5 outside the $P^+$- region 8.

This structure makes an operation with an inverter circuit possible.

Tenth, in this semiconductor device, there are a plurality of the first circuit elements of the high-voltage circuit portion 2, and the plurality of the first circuit elements are isolated from each other by the thick insulation film which is formed on the N⁻- region 6.

This structure eliminates the necessity of using a PN isolation which reaches the P⁻- semiconductor substrate 5 which is otherwise used in the conventional CMOS process for the purpose of isolation of the circuit elements, which makes such a circuit structure possible without ensuring isolation with a high breakdown voltage.

The foregoing has described a principal method of use of the present invention in relation to a semiconductor device which comprises a circuit which is used in a condition that a reference potential becomes as large as a few hundreds volts, such as a driving circuit in an inverter circuit portion. However, the present invention is not limited to the method of use described above. For example, the P- regions 7 may be grounded in FIG. 9 and the potential of the N⁻- region 6 may be set to a low potential (which is 20 V or lower, for instance), so that the present invention is widely applicable to general ICs.

Further, while the high-voltage circuit portion is inside and the low-voltage circuit portion is outside in the preferred embodiment described above, the N⁻- region 6 may be formed in a region except for a central portion of the P⁻- semiconductor substrate 5 so that the high-voltage circuit portion is outside and the low-voltage circuit portion is inside. In addition, although the first conductivity type is the P type and the second conductivity type is the N type in the preferred embodiment described above, a structure in which the first conductivity type is conversely the N type and the second conductivity type is the P type, i.e., a structure with the opposite conductivity types to the preferred embodiment described above is also a preferred embodiment.

Figure 10:
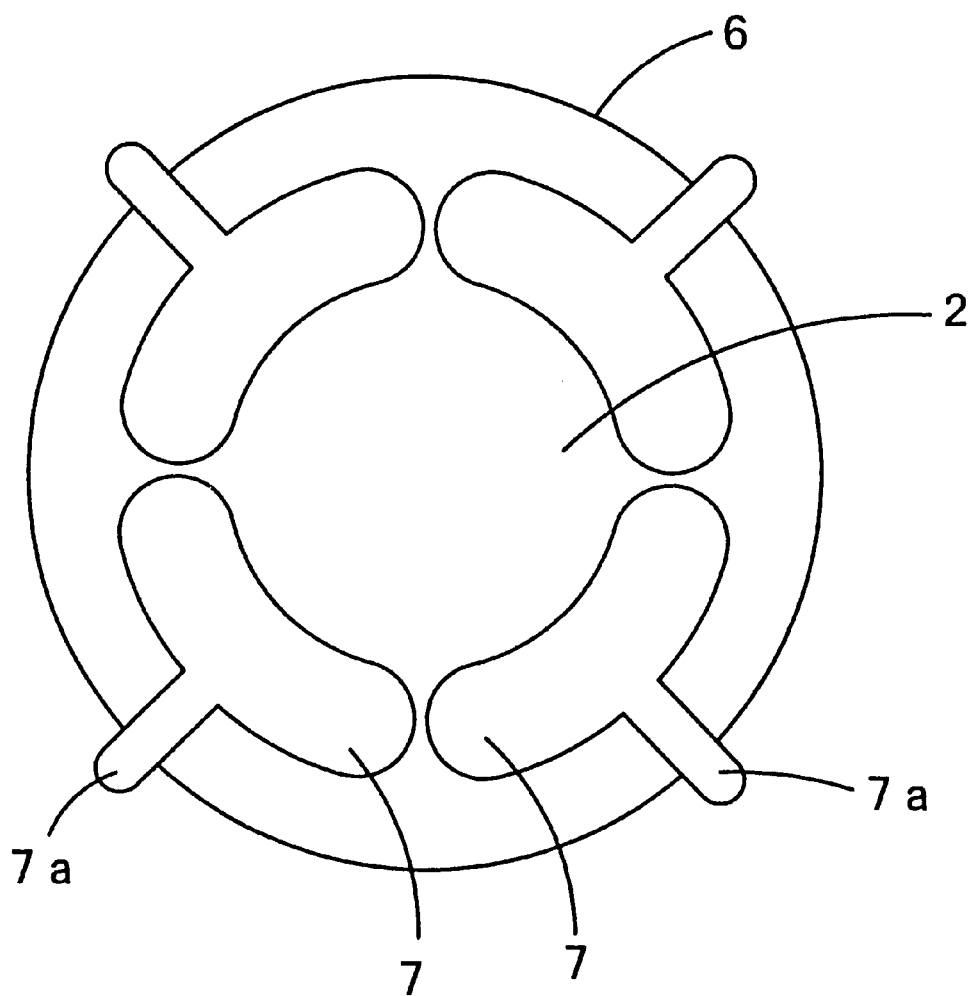
FIGS. 10 and 11 are schematic plan views showing structures of the semiconductor device according to other examples of the preferred embodiment of the present invention.
Figure 11:
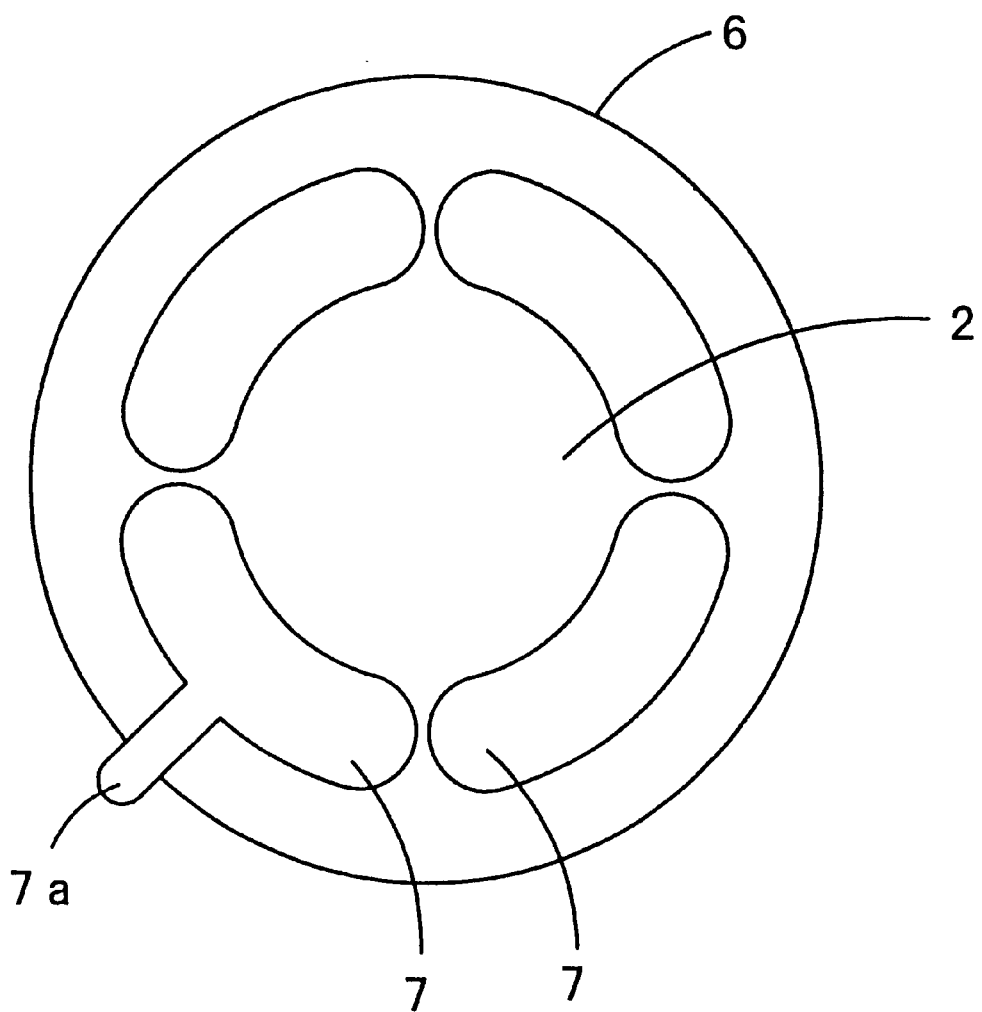
Figure 12:
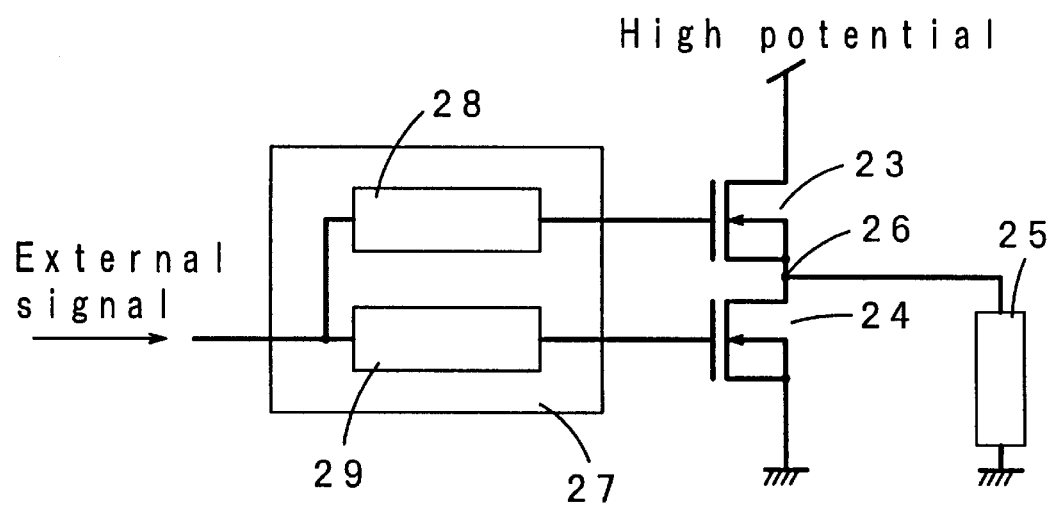
FIG. 12 is a circuit diagram showing a schematic structure of a conventional inverter circuit.
Figure 13:
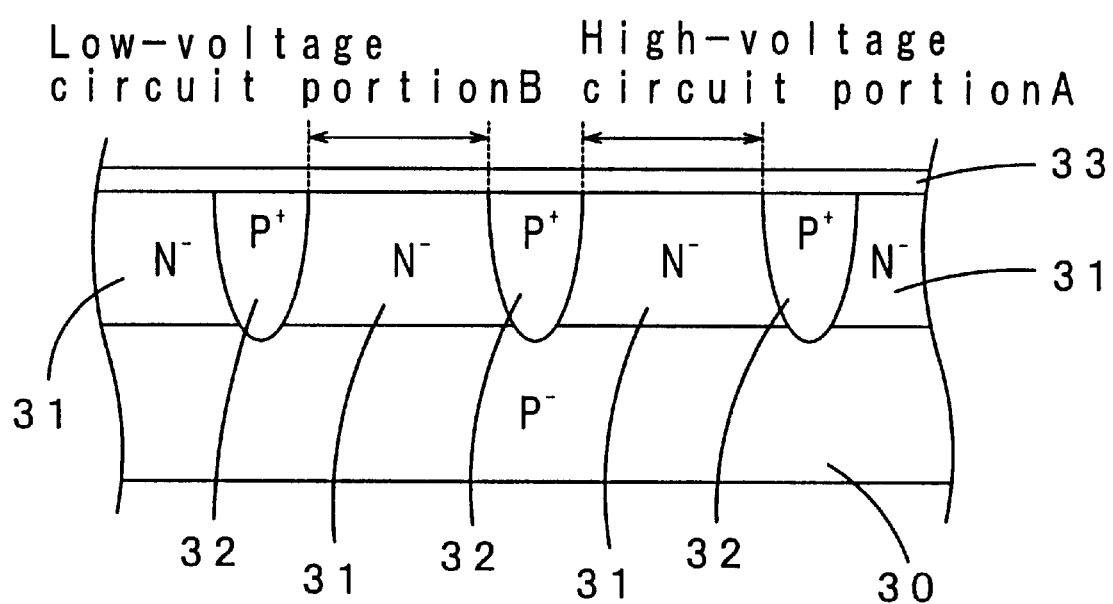
FIG. 13 is a cross sectional view showing a schematic structure of conventional semiconductor device.
Figure 14:
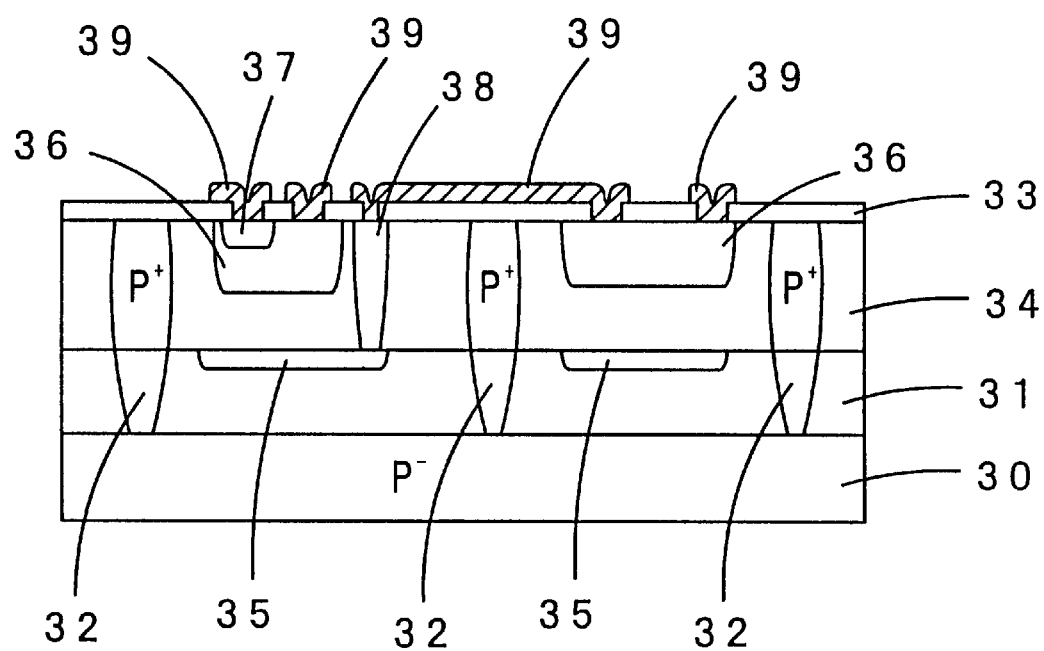
FIG. 14 is a cross sectional view showing a schematic structure of conventional high-insulation semiconductor device.

Still further, while the P- regions 7 are formed as a continuous ring in the preferred embodiment described above, it is not particularly necessary to form the P- regions 7 continuously. Rather, the P- regions 7 may be formed intermittently as shown in FIG. 10, for instance, as far as the depletion layer surrounds the N⁻- region 6. In addition, it is not necessary that the tongue-like projected regions 7a are formed entirely in the P- regions 7 which are isolated. Rather, as shown in FIG. 11, the tongue-like projected region 7a may be formed only in one of the P- regions 7. This is because the plurality of isolated P- regions 7 are connected to each other by a wire or the like which is not shown. Moreover, the gate electrode 11 as well may be formed intermittently. Further, the P⁺- region 8 as well may be formed intermittently. Of course, the gate electrode 11, the drain electrode 15 and the source electrode 16 need not be continuous rings, but rather may be formed partially.

I claim:

1. A semiconductor device, comprising:
   a first conductivity type semiconductor substrate;
   a second conductivity type region which is formed within said first conductivity type semiconductor substrate;
   a first conductivity type region which is formed within said second conductivity type region, so as to surround a portion within said second conductivity type region;
   a first conductivity type high concentration region which is formed within said first conductivity type semiconductor substrate, so as to surround said second conductivity type region;
   a gate electrode which is formed on a channel region, which is disposed between said second conductivity type region and said first conductivity type high concentration region, through a gate insulation film; and
   a first circuit element which is formed in said portion within said second conductivity type region,
   wherein said first conductivity type region, said first conductivity type high concentration region and said gate electrode are electrically connected to each other.

2. The semiconductor device of claim 1, wherein a second circuit element is formed in said first conductivity type semiconductor substrate outside said first conductivity type high concentration region.

3. The semiconductor device of claim 2, wherein said first circuit element is a low dielectric strength circuit element.

4. The semiconductor device of claim 2, wherein said first conductivity type region, said first conductivity type high concentration region and said gate electrode are set to a reference potential of a circuit which is formed in said first conductivity type semiconductor substrate outside said first conductivity type high concentration region.

5. The semiconductor device of claim 2, wherein at least a portion of said first conductivity type region is formed across a surface-side boundary between said second conductivity type region and said first conductivity type semiconductor substrate.

6. The semiconductor device of claim 2, wherein a diffusion depth of said first conductivity type region is shallower than a diffusion depth of said second conductivity type region.

7. The semiconductor device of claim 2, wherein said gate electrode is formed extending on a thick insulation film which is formed on said first conductivity type region.

8. The semiconductor device of claim 2, wherein a plan configuration of said first conductivity type region is a rectangular or square shape whose corner portions have a curvature or a circular shape.

9. The semiconductor device of claim 2, wherein an operation reference potential of said first circuit element is higher than a reference potential of said second circuit element which is formed in said first conductivity type semiconductor substrate outside said first conductivity type high concentration region.

10. The semiconductor device of claim 2, wherein there are a plurality of said first circuit elements, and said plurality of said first circuit elements are isolated from each other by a thick insulation film which is formed on said second conductivity type region.

11. The semiconductor device of claim 1, wherein said first circuit element is a low dielectric strength circuit element.

12. The semiconductor device of claim 1, wherein said first conductivity type region, said first conductivity type high concentration region and said gate electrode are set to a reference potential of a circuit which is formed in said first conductivity type semiconductor substrate outside said first conductivity type high concentration region.

13. The semiconductor device of claim 1, wherein at least a portion of said first conductivity type region is formed across a surface-side boundary between said second conductivity type region and said first conductivity type semiconductor substrate.

14. The semiconductor device of claim 1, wherein a diffusion depth of said first conductivity type region is shallower than a diffusion depth of said second conductivity type region.

15. The semiconductor device of claim 1, wherein said gate electrode is formed extending on a thick insulation film which is formed on said first conductivity type region.

16. The semiconductor device of claim 1, wherein a plan configuration of said first conductivity type region is a rectangular or square shape whose corner portions have a curvature or a circular shape.

17. The semiconductor device of claim 1, wherein an operation reference potential of said first circuit element is higher than a reference potential of a second circuit element which is formed in said first conductivity type semiconductor substrate outside said first conductivity type high concentration region.

18. The semiconductor device of claim 1, wherein there are a plurality of said first circuit elements, and said plurality of said first circuit elements are isolated from each other by a thick insulation film which is formed on said second conductivity type region.

19. A semiconductor device, comprising:
   a first conductivity type semiconductor substrate;
   a second conductivity type region which is formed within said first conductivity type semiconductor substrate, except at a central portion of said first conductivity type semiconductor substrate;
   a first conductivity type region which is formed within said second conductivity type region, so as to surround said central portion of said first conductivity type semiconductor substrate;
   a first conductivity type high concentration region which is formed within said central portion of said first conductivity type semiconductor substrate, so as to surround a portion of said central portion of said first conductivity type semiconductor substrate;
   a gate electrode which is formed on a channel region, which is disposed between said second conductivity type region and said first conductivity type high concentration region, through a gate insulation film; and
   a first circuit element which is formed in a portion within said second conductivity type region outside said first conductivity type region,
   wherein said first conductivity type region, said first conductivity type high concentration region and said gate electrode are electrically connected to each other.

20. The semiconductor device of claim 19, wherein a second circuit element is formed in said portion of said central portion of said first conductivity type semiconductor substrate.

21. The semiconductor device of claim 20, wherein said first circuit element is a low dielectric strength circuit element.

22. The semiconductor device of claim 20, wherein said first conductivity type region, said first conductivity type high concentration region and said gate electrode are set to a reference potential of a circuit which is formed in a portion of said central portion of said first conductive type semiconductor substrate.

23. The semiconductor device of claim 19, wherein said first circuit element is a low dielectric strength circuit element.

24. The semiconductor device of claim 19, wherein said first conductivity type region, said first conductivity type high concentration region and said gate electrode are set to a reference potential of a circuit which is formed in said portion of said central portion of said first conductivity type semiconductor substrate.

* * * * *